(12) United States Patent
Haspel et al.

(10) Patent No.: US 9,543,552 B2
(45) Date of Patent: Jan. 10, 2017

(54) EMF-SHIELDED PLASTIC PREPREG HYBRID STRUCTURAL COMPONENT

(75) Inventors: Julian Haspel, Bonn (DE); Jürgen Selig, Hong Kong (HK)

(73) Assignee: LANXESS Deutschland GMBH, Cologne (DE)

( * ) Notice: Subject to any disclaimer, the term of this patent is extended or adjusted under 35 U.S.C. 154(b) by 762 days.

(21) Appl. No.: 13/820,214

(22) PCT Filed: Sep. 1, 2011

(86) PCT No.: PCT/EP2011/065128
§ 371 (c)(1),
(2), (4) Date: Oct. 14, 2013

(87) PCT Pub. No.: WO2012/028689
PCT Pub. Date: Mar. 8, 2012

(65) Prior Publication Data
US 2014/0030582 A1   Jan. 30, 2014

(30) Foreign Application Priority Data
Sep. 1, 2010  (EP) .................................... 10174914

(51) Int. Cl.
| H01M 8/20 | (2006.01) |
| H01M 2/02 | (2006.01) |
| B29C 45/00 | (2006.01) |
| B29C 45/14 | (2006.01) |
| B32B 1/00 | (2006.01) |
| B32B 3/08 | (2006.01) |
| B32B 5/08 | (2006.01) |

(Continued)

(52) U.S. Cl.
CPC ........ *H01M 2/0295* (2013.01); *B29C 45/0013* (2013.01); *B29C 45/14* (2013.01); *B32B 1/00* (2013.01); *B32B 3/08* (2013.01); *B32B 5/08* (2013.01); *B32B 5/26* (2013.01); *B32B 5/28* (2013.01); *B32B 27/04* (2013.01); *H01M 2/0262* (2013.01); *H01M 2/0285* (2013.01); *H05K 9/009* (2013.01); *H05K 9/0047* (2013.01); *B29K 2995/0005* (2013.01); *B29K 2995/0011* (2013.01); *B29L 2031/7146* (2013.01); *Y10T 428/24124* (2015.01); *Y10T 442/3472* (2015.04); *Y10T 442/3813* (2015.04); *Y10T 442/659* (2015.04)

(58) Field of Classification Search
CPC .......................... B29C 45/0013; H05K 9/0047
USPC .................................. 429/163; 428/113, 239
See application file for complete search history.

(56) References Cited

U.S. PATENT DOCUMENTS

| 6,090,728 A | 7/2000 | Yenni, Jr. et al. |
| 6,485,595 B1 | 11/2002 | Yenni, Jr. et al. |
(Continued)

FOREIGN PATENT DOCUMENTS

| DE | 202004008122 U1 | 10/2005 |
| DE | 102004060009 A1 | 7/2006 |
(Continued)

*Primary Examiner* — Emily Le
*Assistant Examiner* — Monique Wills

(57) ABSTRACT

The present invention relates to an EMF-screened plastic-organic sheet hybrid structural component, preferably a battery housing, and to its use in motor vehicles, preferably in electrically powered motor vehicles or hybrid motor vehicles, the abbreviation EMF meaning electromagnetic field(s).

17 Claims, 4 Drawing Sheets

(51) Int. Cl.
*B32B 5/26* (2006.01)
*B32B 5/28* (2006.01)
*B32B 27/04* (2006.01)
*H05K 9/00* (2006.01)
*B29L 31/00* (2006.01)

(56) References Cited

U.S. PATENT DOCUMENTS

| | | |
|---|---|---|
| 7,879,435 B2 | 2/2011 | Mett et al. |
| 8,695,202 B2 | 4/2014 | Borger |
| 2006/0097539 A1 | 5/2006 | Noisternig et al. |
| 2009/0253844 A1* | 10/2009 | Akiyama ............... C08L 71/12 524/413 |
| 2012/0040251 A1* | 2/2012 | Wetzel .................. H01M 4/20 429/246 |

FOREIGN PATENT DOCUMENTS

| | | |
|---|---|---|
| DE | 102006013684 A1 | 9/2007 |
| DE | 102008021103 A1 | 10/2009 |
| DE | 102008048334 A1 | 4/2010 |
| DE | 102008059947 A1 | 6/2010 |
| DE | 102008059955 A1 | 6/2010 |
| DE | 102008063651 A1 | 7/2010 |
| JP | 011555691 A | 6/1989 |
| JP | 2004082141 A | 3/2004 |
| JP | 2005264097 A | 9/2005 |
| KR | 100370069 B1 | 1/2003 |

\* cited by examiner

A-A

B

A

B

B

B-B

EMF-SHIELDED PLASTIC PREPREG HYBRID STRUCTURAL COMPONENT

The present invention relates to an EMF-screened plastic-organic sheet hybrid structural component, preferably a battery housing, and to its use in motor vehicles, preferably in electrically powered motor vehicles or hybrid motor vehicles. In this connection, EMF means electromagnetic field(s).

BACKGROUND INFORMATION

Low-frequency electric and magnetic fields (greater than 0 Hz to 100 kHz) are primarily caused by industrial applications. Each electric conductor in which current flows is surrounded by a magnetic field and an electric field. Of everyday importance are mainly the electric and magnetic fields which are produced by the power supply (50 Hz) and electrified traffic systems such as railways (16 ⅔ Hz). Because of their physical characteristics, electric and magnetic fields are present in decoupled form in the low-frequency range.

High-frequency electromagnetic fields (>100 kHz-300 GHz) (HF-EMF) in our everyday life primarily occur in applications which are used for wire-free information transmission in broadcasting, television, mobile radio and other communication technologies. Other important areas of application are medicine and numerous industrial processes. In HF-EMF, the electric and magnetic components are very closely coupled with one another at a distance from the source that depends on the wavelength. In the case of very short wavelengths, it is therefore barely possible to attribute effects and actions which, for example, occur when they strike the human body, to the action of only one of the two components.

The higher and higher power of batteries required recently and also in the future, in particular in the motor vehicle sector, leads to these batteries, owing to their electromagnetic fields, increasingly being able to exert an influence on the on-board electronics of vehicles, in particular motor vehicles, or being able to exert an influence on the wire-free transmission of information, and being able to quite considerably disrupt those on-board electronics or information transmission electronics. Other areas of application such as medical appliances or telecommunication or navigation devices can also be affected.

JP 2004-082141 A discloses an injection-moulded structural component for screening electromagnetic fields (EMF), for example for use as a housing part for batteries in motor vehicles, composed of a thermoplastic material, namely polypropylene, which has a high electrical conductivity as a result of the addition of metal fibres.

JP 2005-264097 A describes an injection-moulded article composed of a coated resin composition made of metal fibres A, a fibrous or cylindrical metal B with a lower melting point than A without any lead being present therein, and a thermoplastic resin C.

The object of the present invention was to elaborate a concept for an EMF-screened structural component which is able both to screen an electro-technical component with respect to external EMF and also to damp the EMF emitted by this component, without having to accept any losses in terms of the mechanical properties.

However, since each structural component has to simultaneously take into account the weight restrictions required in current automobile construction, the lightest possible construction of the same is required.

SUMMARY OF THE INVENTION

The solution to the object and thus the subject-matter of the present invention is an EMF-screened hybrid structural component which ensures screening and damping of >50 db in the frequency range from 100 MHz to 1 GHz in accordance with ASTM D-4935-89, preferably a battery housing.

DESCRIPTION OF THE INVENTION

Figure 1:
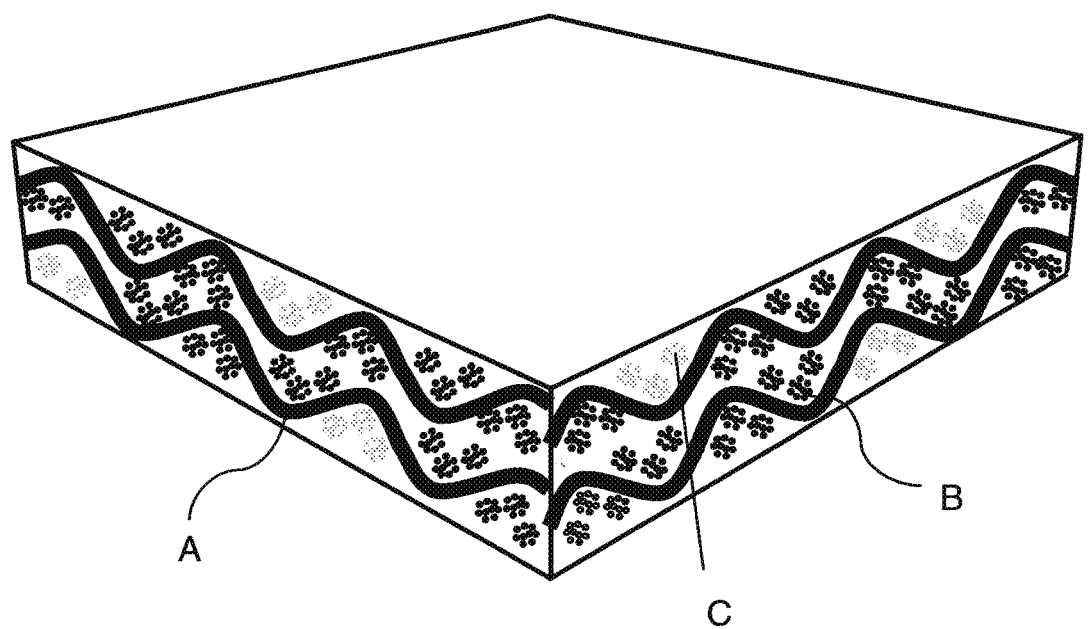
FIG. 1 shows an organic sheet structure to be used in accordance with the invention. Here, A means woven glass fibre fabric in the section direction, B means woven glass fibre fabric at right angles to the section direction and C means woven metal or carbon fibre fabric at right angles to the section direction.

An EMF-screened hybrid structural component, such as a battery housing, which ensures screening and damping of >50 db in the frequency range from 100 MHz to 1 GHz in accordance with ASTM D-4935-89, is, in an embodiment, characterized in that this structural component a) consists of an organic sheet component which, in turn, is built up from a woven fabric or laid fabric in a plurality of layers made of a fibrous filler, into which, in addition, carbon fibres or metal fibres are also incorporated, this woven fabric or laid fabric being embedded in a thermoplastic, and b) additionally consists of a further plastic component, preferably of a thermoplastic, which has a high electrical conductivity and a high electrical conductivity means that the further plastic component has a volume resistance of up to $10^3$ Ω cm to ISO 3915 and a surface resistance of up to $10^3$ Ω to IEC 60093.

According to the invention, the organic sheet component consists of at least one, preferably one, organic sheet.

Organic sheets and their use in motor vehicle construction are prior art.

Organic sheet is understood to mean an initially plate-like semi-finished product made of fibre-reinforced thermoplastic. For example, organic sheets to be used in accordance with the invention and a process for their production are described in DE 10 2006 013 684 A1 or in DE 10 2004 060 009 A1. Pre-pregs, an alternative expression for organic sheet, made of a textile substrate and binder, the binder substantially consisting of isolated dots, are disclosed in DE 20 2004 008 122 U1.

The use of such organic sheets in the form of hollow subassemblies for automobile construction is the subject matter of DE 10 2006 032 867 A1.

The use of organic sheets as instrument panel supports in the motor vehicle sector is described in DE 10 230 410 A1; likewise their use as a moulded structural component for bodyshell construction is described in DE 20 2006 019 341 U1.

DE 10 2007 047 012 A1 describes the use of organic sheets for the production of a moulded body, as do DE 10 2008 048 334 A1 and DE 10 2008 063 651 A1.

The use of such an organic sheet as a front wall of a vehicle cab and of a cross-member is the subject matter of DE 10 2008 021 103 A1.

A plate-like semi-finished product/organic sheet to be used in accordance with the invention is composed of a thermoplastic matrix, which is reinforced by a woven fabric, laid fabric or unidirectional woven fabric.

Preferred woven fabrics are unidirectional woven fabrics. The woven fabrics preferably consist of glass fibres, aramide or a mixed form of these components. According to the invention, glass fibres are particularly preferred.

Particularly preferred according to the invention are woven fibre fabrics or fibre felts made of glass fibres which are surrounded with a matrix of thermoplastic. For the EMF screening, carbon or metal fibres are additionally used in the organic sheet component. The content of carbon fibres or metal fibres in the organic sheet component is 0.1% by volume to 30% by volume, preferably 10% by volume to 30% by volume, based on total fibre content, the total fibre content lying in the range from 30% by volume to 60% by volume, based on 100% by volume of organic sheet. The metal fibres used are preferably steel fibres.

The carbon or metal fibres are introduced into the organic sheet component in order to achieve the electromagnetic screening action needed for the battery technology. The carbon or metal fibres are added in a proportion that is just necessary to achieve the desired EM-screening property. No such action could be achieved with conventional organic sheets on a pure glass fibre basis.

The semi-finished product/organic sheet is completely impregnated with this thermoplastic and consolidated, i.e. the fibres are already wetted completely with plastic, there is no air in the material and the semi-finished product is merely shaped into three-dimensional components by means of heating and subsequent pressing in short cycle times. During the shaping, the material does not pass through any chemical conversion.

The fibre network can be oriented only in one direction or in two directions at any desired angle to one another, preferably oriented at right angles to one another.

In one preferred embodiment, the woven fibre fabric is embedded in the plastic matrix such that it is (very) oriented (stretched), with a high level of orientation and with a high proportion of fibre.

Organic sheets to be produced in such a way and to be used in accordance with the invention preferably have thicknesses of 0.3 to 6 mm, particularly preferably of 0.5 to 3 mm.

Thermoplastics are suitable as a functional material for the production of the organic sheet, preferably polyamides, in particular aromatic polyamides such as polyphthalamide, polysulfone PSU, polyphenylene sulphide PPS, polyphthalamides (PPA), poly(arylenethersulfones), such as PES, PPSU or PEI, polyesters, preferably polybutylene terephthalate (PBT) or polyethylene terephthalate (PET), polypropylene (PP), polyethylene (PE) or polyimide (PI). Further implementation variants will be found in DE 10 2006 013 684 A1.

Likewise, thermoplastics are preferably used for the plastics to be used in the plastic component b). Particularly preferably, use is also made here of the thermoplastics named above in the organic sheet component. In a quite particularly preferred embodiment, both the organic sheet component and the plastic component b) are made from the same thermoplastic material.

This fibre-reinforced plastic matrix of the organic sheet component substantially fulfils the mechanical properties required in accordance with the invention. Further functions such as fixing, sealing, protection against liquid media and the like are, inter alia on account of the geometric complexity, formed by the further component b). According to the invention, the latter is composed of an electrically conductive thermoplastic, which is formed by casting, preferably injection moulding, and connected to the organic sheet component. In the process, the organic sheet shaped as described above is inserted into a mould, preferably an injection mould, having an appropriately configured mould cavity. The plastic component b) is then injected and therefore brought to the appropriate shape. The aim is that an integral connection is formed between the plastic of the organic sheet component and the plastic which represents the component b). At best, such an integral connection is achieved by those two plastics having the same polymer base, in particular when both are based on a polyamide 6. In addition, process parameters such as melt temperature and pressure also play a part.

Figure 2:
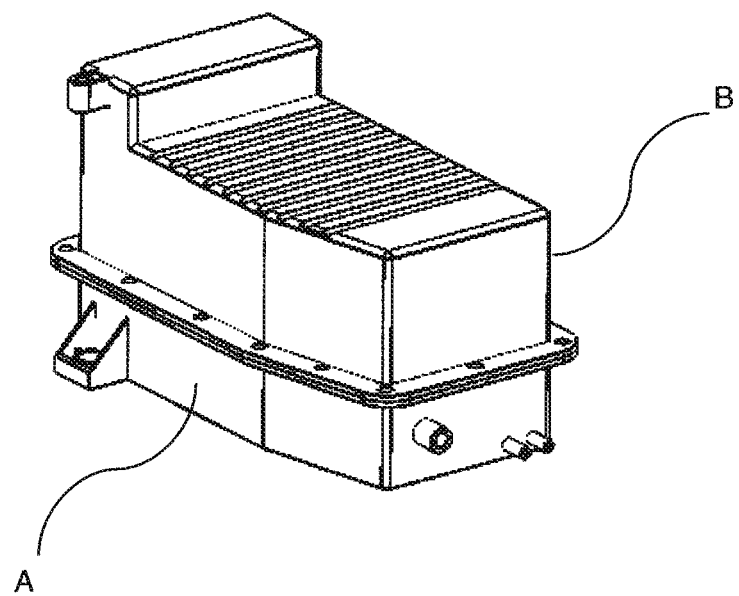
FIG. 2 shows, by way of example, a battery housing as a hybrid structural component, comprising a lower part (A) provided with fixing elements and various connections (e.g. for electricity and cooling), screwed to an upper part (B). The two parts are sealed with respect to external influences via a seal (e.g. round elastomer seal) in the screw/flange area.
Figure 3:
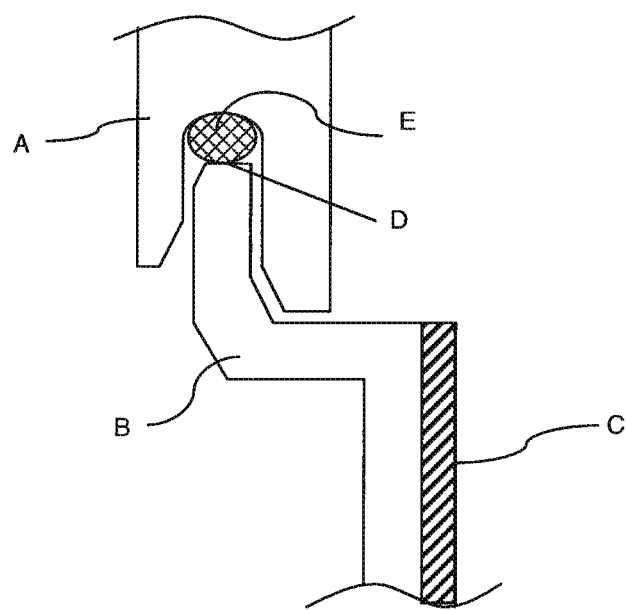
FIG. 3 shows an example of a section through a hybrid structural component according to the invention, comprising a housing upper part (A), a housing lower part having two material components (B) and (C) and a seal (E). In the area of the bends, this housing part consists of an electrically conductive plastic (B), with which the sealing surface (D) is also formed; outside this area, the lower part also consists of an organic sheet (C).
Figure 4:
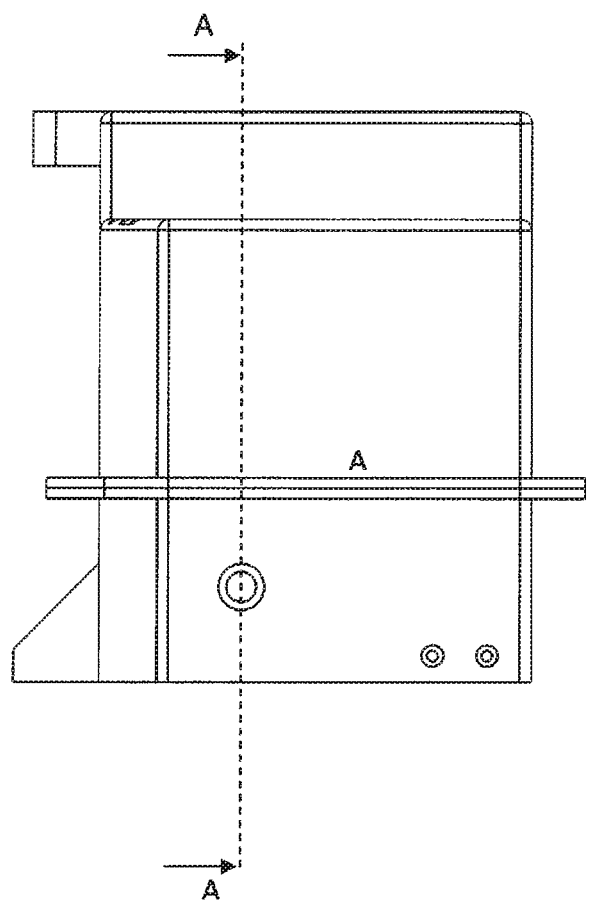
FIG. 4 shows the battery housing from FIG. 2 in front view.
Figure 5:
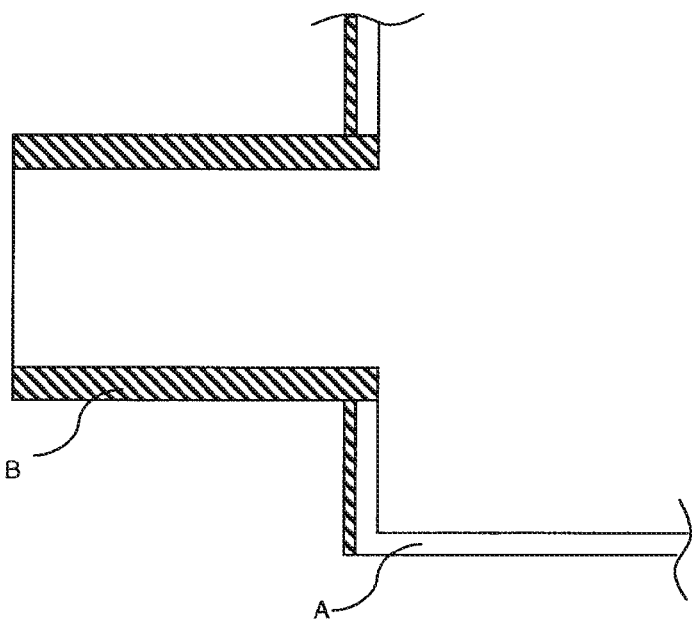
In FIG. 5, the section A-A from FIG. 4 is shown, in which (B) consists of an electrically conductive plastic and (A) of an organic sheet.
Figure 6:
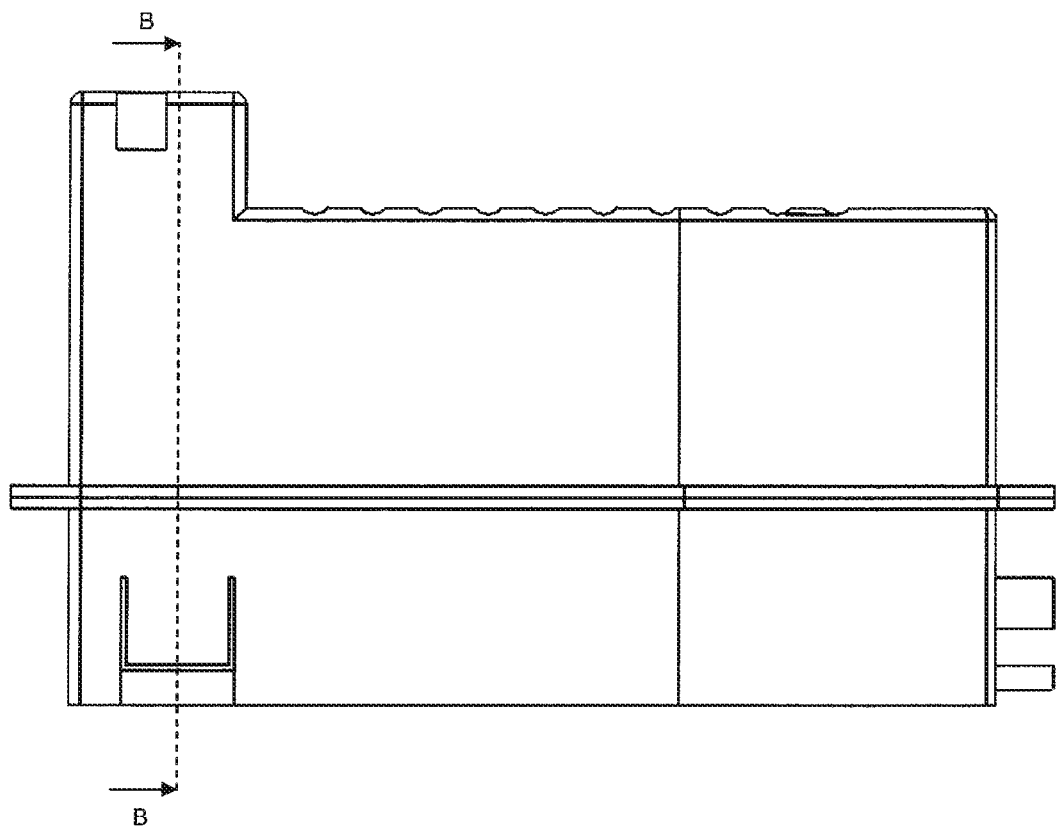
FIG. 6 shows the battery housing from FIG. 2 in a side view.
Figure 7:
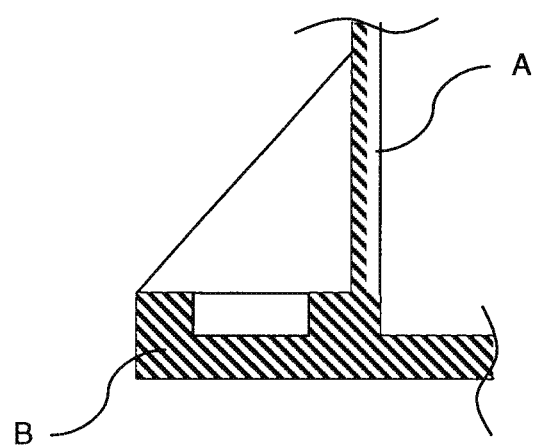
FIG. 7 shows the section B-B from FIG. 6, (B) consisting of an electrically conductive plastic and (A) of an organic sheet.

As a result of the high electrical conductivity of the plastic to be used as component b), an EM-screening action can be achieved even in those geometric areas of the hybrid structural component which are difficult to represent by the organic sheet for process engineering reasons, and thus gaps (what are known as apertures) in the EM screen are minimized. One example of such areas is the sealing contour of a housing, as illustrated in FIG. 3: For instance, as a result of the predefined overall space, small radii and two bends following at a short distance are needed, which are thus not completely feasible by means of an organic sheet. In addition, flat sealing surfaces, as in the case of a multi-part housing with seal, cannot be formed by the side surface of an organic sheet. A further example is the plug area of the housing from FIG. 2 (FIG. 5), which, in this or a similar still more complex form, cannot be formed by the organic sheet. FIG. 7 finally shows a fixing peg of the housing from FIG. 2, which would likewise not be suitable for a representation by the organic sheet. Therefore, such geometrically more complex or filigree areas are formed by the functional material, preferably a thermoplastic, with high electrical conductivity. By using such a material, as a result of its processing behaviour, preferably in injection moulding, greater stylistic freedom is provided.

According to the invention, the electrical conductivity of the plastic to be used as component b), preferably the thermoplastic, is achieved by the addition of carbon, metal fibres or carbon nanotubes. As based on 100% by volume of total filler content of the plastic component or thermoplastic moulding compounds to be used therefore, carbon, metal fibres or carbon nanotubes are added in the range from 0.1-30% by volume, the total filler content lying in the range from 0.1 to 50% by volume, based on 100% plastic component.

In a preferred embodiment of the present invention, the plastic-organic sheet hybrid structural component according to the invention has a shell-like form or a cylindrical or box-like form. However, the form can also be matched individually to the vehicle geometry, since such a hybrid structural component is definitely to be used preferably in accordance with the invention as a battery housing, and future batteries in motor vehicles can be located in different positions.

Furthermore, additional functions can be incorporated in the plastic-organic sheet hybrid structural component preferably to be used in accordance with the invention as a battery housing, as are known from DE 10 2008 059 947 A1 or DE 10 2008 059 955 A1 for battery housings, preferably cooling plates with integrated cooling channels or heat-conducting plates.

An EMF-screened plastic-organic sheet hybrid structural component according to the invention is suitable in particular for use in motor vehicle battery housings. These materials are distinguished by the following properties:
  significantly higher energy absorption as compared with a pure plastic solution, a pure metal variant and also with respect to a plastic-metal hybrid variant with the same weight in each case, which in the event of a crash is of considerable significance for the motor vehicle battery and its functional stability.
  As compared with thermosetting, long-glass-fibre-reinforced materials, components do not have to be reworked.
  As compared with a pure metal sheet variant and plastic-metal hybrids, no investment for sheet shaping tools is necessary.
  Plastic components can be welded on and, on the battery housing, further functions can thus be connected closely with the latter and the function of the battery.

By means of the present invention, a plastic-organic sheet hybrid material can be designed firstly by means of the specific use of carbon or steel fibres in the organic sheet and secondly by means of the use of an electrically conductive plastic as further component b) in such a way that an adequate EMF action can be achieved, it being possible for apertures in the EM screen to be minimized. Therefore, the material is also suitable for the application in automobile battery housings.

Adequate EMF action in the sense of the present invention means screening or damping of >50 db in the frequency range from 100 MHz to 1 GHz to ASTM D-4935-89.

Other plastic-based solutions (such as, for example, electrically conductive compounds, galvanized plastic components, plastic-metal hybrids) can certainly (at least theoretically) also develop an EMF action. By comparison, however, a plastic-organic sheet hybrid variant according to the invention offers considerable advantages:
  lower weight (as compared with plastic-metal hybrids, metal sheet, cast aluminium)
  better mechanical behaviour, higher energy absorption (as compared with conductive, metal-filled plastics, plastic-metal hybrids)
  better resistance with respect to liquid media, such as, for example, electrolyte liquid of batteries (as compared with galvanized or metal-vapour-deposited plastics).

The present invention therefore also relates to the use of a hybrid structural component which
a) consists of an organic sheet component which, in turn, is built up from a woven fabric or laid fabric in a plurality of layers made of a fibrous filler, into which, in addition, carbon fibres or metal fibres are also incorporated, this woven fabric or laid fabric being embedded in a thermoplastic, and
b) additionally consists of a further plastic component, preferably of a thermoplastic, which has a high electrical conductivity which is expressed by a volume resistance of up to $10^3$ Ωcm to ISO 3915 and a surface resistance of up to $10^3$ Ω to IEC 60093, in that, based on 100% by volume of total filler content of the plastic component, carbon, metal fibres or carbon nanotubes are added in the range from 0.1-30% by volume, the total filler content lying in the range from 0.1-50% by volume, based on 100% plastic component,
for screening electromagnetic fields (EMF).

The present invention preferably relates to the use of the plastic-organic sheet hybrid structural component according to the invention as an EMF-screening hybrid structural component in vehicles, preferably in motor vehicles.

Preferred EMF-screening plastic-organic sheet hybrid structural components in the sense of the present application are, however, in addition to battery housings, also other housings which accommodate electronic component parts, preferably fuse boxes, devices from the telecommunications sector or navigation sector and others.

In a preferred embodiment, in addition to the carbon fibres or metal fibres in the organic sheet component, glass fibres or aramide or a mixed form of these constituents are used as a non-EMF screening fibrous filler.

For the purpose of clarification, it should be noted that all definitions and parameters listed, cited more generally or in preferred ranges in any desired combinations are covered by the scope of the invention.

The invention claimed is:
1. An EMF-screening structural component comprising:
  at least a first organic sheet component comprising:
    a fabric layer; and
    at least one of: carbon fibres and metal fibres embedded in a first thermoplastic; and
  a second polymeric component integrally connected with the first sheet component, the second polymeric component comprising at least one of: carbon, metal fibres, and carbon nanotubes embedded in a second polymer;
  wherein together:
    the first organic sheet component comprises a first amount of the at least one of the carbon fibres and the metal fibres, and
    the second polymeric component comprises a second amount of the least one of: the carbon, the metal fibres, and the carbon nanotubes sufficient to provide the structural component with a predetermined level of EMF screening and damping of 50 db in the frequency range from 100 MHz to 1 GHz in accordance with ASTM D-4935-89.

2. The structural component of claim 1, wherein the second polymeric component is an electrically conductive thermoplastic wherein the second amount of the at least one of:
the carbon, the metal fibres, and the carbon nanotubes is sufficient to provide the second thermoplastic material with a volume resistance of up to $10^3$ Ω cm to ISO 3915 and a surface resistance of up to $10^3$ Ω.

3. The structural component of claim 2, wherein:
the first organic sheet component comprises a fiber content of 30 to 60 vol % of the volume of the sheet, wherein the fiber content comprises fibres of the fabric and the at least one of the carbon fibres and the metal fibres, and the at least one of the carbon fibres and the metal fibres comprise 0.1 to 30 vol % of the fiber content; and
the second polymeric component has a filler content of 0.1 to 50 vol % of the volume of the second polymeric component, wherein the filler content comprises the at least one of: the carbon, the metal fibres, and the carbon nanotubes, and the at least one of: the carbon, the metal fibres, and the carbon nanotubes comprise 0.1 to 30 vol % of the filler content.

4. The structural component of claim 1, wherein the second polymeric component is integrally molded onto a preformed first organic sheet component.

5. The structural component of claim 4, wherein the first thermoplastic and the second polymer are the same and are selected from polyamides, polysulfone, polyphenylene sulphide, polyphthalamides, poly(arylenethersulfones), polyesters, polypropylene (PP), polyethylene (PE) or polyimide (PI).

6. The structural component of claim 5, wherein the first thermoplastic and the second polymer are aromatic polyamide.

7. The structural component of claim 4, wherein the structural component has portions that cannot be formed by shaping of the first organic layer, and the portions that cannot be formed by shaping of the first organic layer comprise the second polymeric component.

8. The structural component of claim 3, wherein:
the second polymeric component is integraliy molded onto a preformed first organic sheet component; and
the structural component has portions that cannot be formed by shaping of the first organic layer, and the portions that cannot be formed by shaping of the first organic layer comprise the second polymeric component.

9. The structural component of claim 8, wherein:
the fabric layer comprises at least one of: woven fibres, laid fibres, and uni-directional fibres; and
the fibres comprise at least one of: glass fibres and aramid fibres.

10. The structural component of claim 9, wherein:
the fabric layer comprises unidirectional glass fibres, and
the at least one of; carbon fibres and metal fibres, comprises steel fibres.

11. The structural component of claim 9, wherein the first organic sheet component comprises a plurality of fiber layers, and at least a portion of the fibres are oriented at right angles to one another.

12. The structural component of claim 1, wherein the first organic sheet component comprises a plurality of fabric layers interspersed with layers of fibrous filler, and the fibrous filler comprises the at least one of the carbon fibres and the metal fibres.

13. The structural component of claim 12, wherein the fibrous filler further comprises glass fibres, or aramid fibres, or a mixed thereof.

14. The structural component of claim 10, wherein:
the metal fibres comprise 10 to 30 vol % of the fiber content of the first organic sheet component;
the first organic sheet component comprises a plurality of fiber layers, and at least a portion of the fibres are oriented at right angles to one another;
the plurality of fabric layers are interspersed with layers of fibrous filler, and the fibrous filler comprises the at least one of the carbon fibres and the metal fibres, and the fibrous filler further comprises glass fibres, or aramid fibres, or a mixed thereof;
the first organic sheet component has a thickness of 0.3 to 6 mm; and
the structural component has a shell-like form or cylindrical form or box-like form and comprises a housing for electronic components.

15. A battery housing with EMF screening, the housing comprising a shell-like form of a structural material comprising:
at least a first shaped-organic sheet component comprising:
a fabric layer; and
at least one of: carbon fibres and metal fibres embedded in a first thermoplastic, wherein portions of the housing cannot be formed by shaping of the first organic layer, and
the portions that cannot be formed by shaping of the first organic layer comprise a second polymeric component integrally connected with the first sheet component, the second polymeric component comprising at least one of: carbon, metal fibres, and carbon nanotubes embedded in a second polymer;
wherein together:
the first organic sheet component comprises a first amount of the at least one of the carbon fibres and the metal fibres, and
the second polymeric component comprises a second amount of the least one of: the carbon, the metal fibres, and the carbon nanotubes sufficient to provide the structural component with a predetermined level of EMF screening and damping of 50 db in the frequency range from 100 MHz to 1 GHz in accordance with ASTM D-4935-89.

16. The structural component of claim 15, wherein the second polymeric component is an electrically conductive thermoplastic wherein the second amount of the at least one of:
the carbon, the metal fibres, and the carbon nanotubes is sufficient to provide the second thermoplastic material with a volume resistance of up to $10^3$Ω cm to ISO 3915 and a surface resistance of up to $10^3$Ω.

17. The housing according to claim 16, wherein:
the first organic sheet component comprises a fiber content of 30 to 60 vol % of the volume of the sheet, wherein the fiber content comprises fibres of the fabric and the at least one of the carbon fibres and the metal fibres, and the at least one of the carbon fibres and the metal fibres comprise 0.1 to 30 vol % of the fiber content; and
the second polymeric component has a filler content of 0.1 to 50 vol % of the volume of the second polymeric component, wherein the filler content comprises the at least one of; the carbon, the metal fibres, and the carbon nanotubes, and the at least one of: the carbon, the metal fibres, and the carbon nanotubes comprise 0.1 to 30 vol % of the filler content.

* * * * *